United States Patent [19]

Reichle

[11] Patent Number: 5,402,315
[45] Date of Patent: Mar. 28, 1995

[54] PRINTED CIRCUIT BOARD AND ASSEMBLY MODULE FOR CONNECTION OF SCREENED CONDUCTORS FOR DISTRIBUTION BOARDS AND DISTRIBUTION SYSTEMS IN LIGHT-CURRENT SYSTEMS ENGINEERING

[75] Inventor: Hans Reichle, Wetzikon, Switzerland

[73] Assignee: Reichle+De-Massari AG, Wetzikon, Switzerland

[21] Appl. No.: 93,673

[22] Filed: Jul. 20, 1993

[30] Foreign Application Priority Data

Jul. 30, 1992 [CH] Switzerland ............ 02 406/92
Jul. 30, 1992 [CH] Switzerland ............ 02 407/92

[51] Int. Cl.⁶ ..................... H05K 1/11; H02G 7/00
[52] U.S. Cl. ..................... 361/784; 174/40 CC; 439/95; 439/100; 439/101; 24/457; 24/483
[58] Field of Search ............ 174/40 CC, 51, 72 A, 174/260; 439/95, 98, 99, 100, 101, 108; 361/784, 785, 789; 24/457, 458, 483

[56] References Cited

U.S. PATENT DOCUMENTS

| | | | |
|---|---|---|---|
| 1,860,829 | 5/1932 | Abbott | 174/51 |
| 2,432,492 | 12/1947 | Tinnerman | 174/40 CC |
| 2,684,994 | 7/1954 | Kwake | 174/51 |
| 3,010,052 | 11/1961 | Heath et al. | 361/784 |
| 3,295,806 | 1/1967 | Modeme | 174/40 CC |
| 4,494,520 | 1/1985 | Hurwitz | 174/72 A |
| 5,131,856 | 7/1992 | Auclair | 439/100 |

FOREIGN PATENT DOCUMENTS

| | | |
|---|---|---|
| 1921192 | 11/1970 | Germany . |
| 2633175 | 1/1978 | Germany . |
| 2112298 | 4/1990 | Japan . |
| 2137390 | 5/1990 | Japan . |
| 3116890 | 5/1991 | Japan . |
| 881847 | 11/1961 | United Kingdom ........ 174/101 |

*Primary Examiner*—Bot Ledynh
*Attorney, Agent, or Firm*—Spencer, Frank & Schneider

[57] ABSTRACT

An assembly module for a printed circuit board for the connection of screened conductors includes a metallic grounding plate comprising multiple modules. Each module includes a mechanism for fixedly connecting the module to a printed circuit board and at least one spring clamp conductively supported on the module. The clamp has an approximately shell-shaped conductor accommodating area for detachably enclosing at least one screened conductor. The plate further includes one rated breakage point between each two adjacent modules so that adjacent modules may be separated from one another by breaking the plate at the rated breakage point.

5 Claims, 1 Drawing Sheet

PRINTED CIRCUIT BOARD AND ASSEMBLY MODULE FOR CONNECTION OF SCREENED CONDUCTORS FOR DISTRIBUTION BOARDS AND DISTRIBUTION SYSTEMS IN LIGHT-CURRENT SYSTEMS ENGINEERING

BACKGROUND OF THE INVENTION

The present invention relates to a printed circuit board.

In many areas of installation engineering, especially in light-current systems for telephone and data communications, the number of printed circuit boards used is steadily increasing.

However, it constitutes a problem that there exists a demand for modular and multi-modular printed circuit boards having a varying number of modules and that the structure of the systems concerned is subject to constant changes requiring the use of additional or less printed circuit boards of the specified type.

In stocking of spares, all this requires a large number of modular printed circuit boards with the same components for each of the systems, which is complicated and expensive.

SUMMARY OF THE INVENTION

Therefore, it is the primary object of the present invention to provide a printed circuit board fulfilling the formulated requirements of multiple and single modularity, respectively.

According to the invention, this is achieved at first by a multi-modular arrangement of modular connection and switching means, next to one another, the printed circuit board having a rated breakage point between each of the adjacent modules of connection and switching means so as to obtain single-module printed circuit boards by breaking.

Now, these measures permit the preparation of multi-modular printed circuit boards having any number of modules, which will then be suitable for obtaining therefrom single-modular or multi-modular partial boards comprising a smaller number of modules by simple breaking, thereby essentially simplifying manufacture and stocking of spares.

If the printed circuit boards are intended for the connection of electrical conductors, which are screened against interfering external electrical fields by a highly conductive, metallic sleeve, a preferred embodiment of the printed circuit board according to the invention may be obtained by a metallic grounding pad extending across the entire length of the printed circuit board and having one rated breakage point each in the extension of the rated breakage points of the printed circuit board for joint separation of the printed circuit board and the grounding pad by breaking.

Accordingly, the present invention also relates to an assembly module for such a printed circuit board for connection of screened conductors for distribution boards and distribution systems in light-current systems engineering.

In telephone or other signal transmission areas, electric conductors which are screened against interfering external electrical fields are indispensable. However, their placement in the connecting system, such as a printed circuit board and the like, constitutes a problem, especially with regard to optimum grounding of the screening in the conductor connection area in terms of RF.

An assembly module of the above type, which may be used anywhere and in any system for connection of screened conductors and which ensures an optimum RF grounding connection of the conductors will now be rendered possible by a metallic grounding pad which may be connected with a connection system such as a printed circuit board and the like in a fixed way and on which at least one spring clamp having an approximately shell-shaped conductor accommodating area and designed so as to detachably enclose at least one conductor is supported in a conductive way.

In this context, it is essential for the invention that the metallic grounding pad be formed as a multiple module and possesses a plurality of spring clamps arranged next to one another, the grounding pad having one rated breakage point each between two adjacent spring clamps so as to obtain single modules by breaking.

Generally, the spring clamp could be a spring arm revited to the grounding pad, however, preferably, the spring clamp is U-shaped. This permits a preferred embodiment such that the spring clamp includes at least two conductor accommodating areas on top of one another so as to accommodate conductors of varying diameters.

According to the invention, the spring clamp may also be used as a strain relief device, or the grounding pad may provide slots for push-through accommodation of a cable coupler.

BRIEF DESCRIPTION OF THE DRAWING

Embodiment examples according to the invention will now be described more particularly with reference to the accompanying drawings, wherein.

DETAILED DESCRIPTION OF THE PREFERRED EMBODIMENTS

Figure 1:
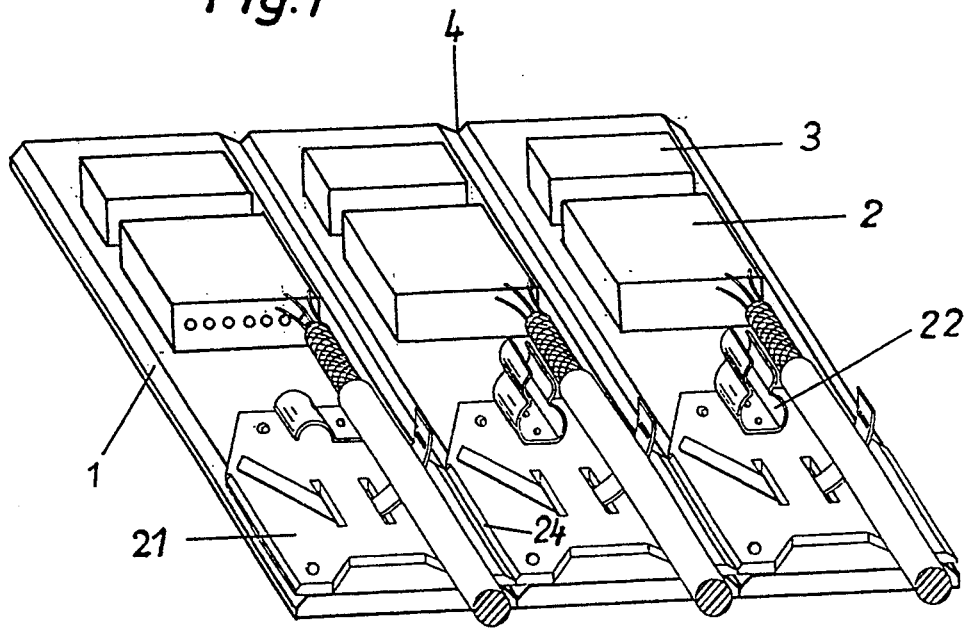
FIG. 1 is a diagrammatic representation of a printed circuit board according to the invention.

The printed circuit board 1 of FIG. 1 is formed in a multi-modular way having connection modules disposed next to one another and formed of, for example, connector module 3 and wire core connection module 2 or the like, and includes a printed circuit corresponding to the relevant application and disposed within the connection module which is not shown herein in further detail.

According to the invention, this multiple-module printed circuit board 1 possesses parallel grooves or the like between the adjacent sets of connection modules 2,3 and disposed at predetermined distances, which form rated breakage points 4 so as to obtain single modules by breaking.

If the printed circuit boards are intended for the connection of electrical conductors, which are screened against interfering external electrical fields by a highly conductive, metallic sleeve, a metallic grounding pad 21 extending across the entire length of the printed circuit board 1 will be mounted which has one rated breakage point 24 each in the extension of the rated breakage points 4 of the printed circuit board 1 for joint separation of printed circuit board and grounding pad by breaking.

Such an assembly module will be set forth hereinafter in further detail with reference made to FIG. 2.

Figure 2:
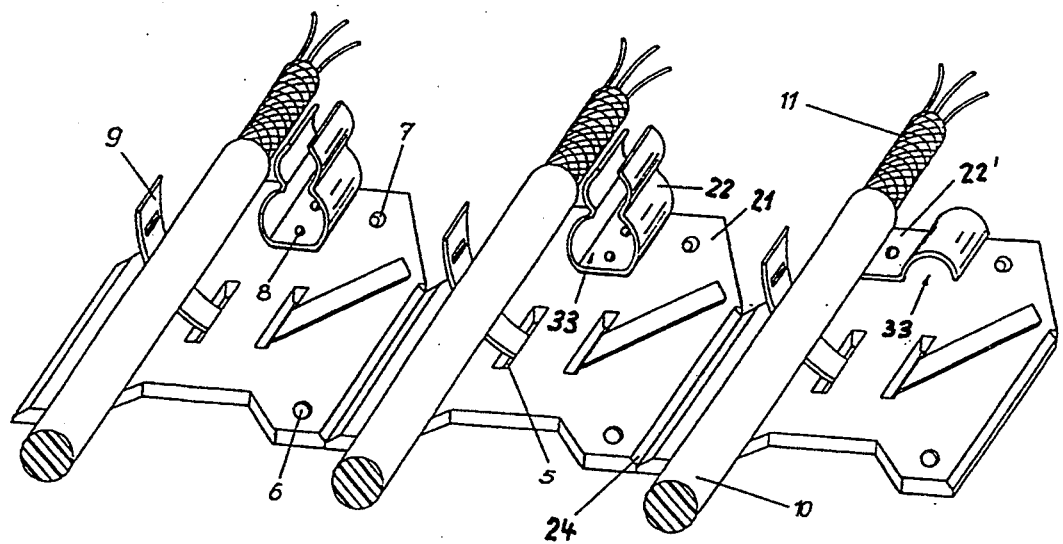
FIG. 2 is a diagrammatic representation of an assembly module according to the invention.

In this case, the assembly module of FIG. 2 for the connection of the screened conductor 10 having a stripped conductor area 11 includes the multiple-module metallic grounding pad 21 which may be connected in a fixed manner with any connection system, in this case a printed circuit board 1 (FIG. 1), for example, by glueing or by forming bore holes 7 therethrough, by screw-connecting or reviting.

Further bore holes 6 may be used for ground connection by solder-connecting of a grounding conductor.

The multiple-module grounding pad 21 possesses parallel grooves or the like disposed at predetermined distances which form rated breakage points 24 so as to obtain single modules by breaking.

Each single module of the grounding pad 21 marked in this way carries one metallic spring clamp 22 and 22', respectively, preferably mounted by riveting 8 or the like, including an approximately shell-shaped conductor accommodating area 33 by which the spring clamps 22 and 22', respectively, enclose the stripped conductor area 11 at least partly in a detachable way and thus form an optimum RF grounding connection between conductor and grounding pad.

It is apparent that a separation of the connection is possible without problems and at any time.

Depending on the spring tension, the spring clamps 22 and 22', respectively, may also be used as a strain relief device, or the grounding pad 21 may provide slots 5 for push-through accommodation of a cable coupler 9.

The spring clamp may be formed as tongue spring 22' or be a U-shaped spring clamp 22 preferably including two conductor accommodating areas on top of one another so as to accommodate conductors having varying diameters.

This embodiment of the assembly module, which is preferably manufactured as multiple module and randomly reduced or separated thereafter, permits unlimited use in all areas where screened conductors are to be connected, optimum grounding in terms of RF being ensured.

Generally, the structure of a printed circuit board module is fully free without departing from the scope of the concept of invention. The multi-modular structure of the printed circuit board, for example, with the maximum number of adjacent modules of an application, is essential, which printed circuit board may then be separated according to the needs for which purpose mere breaking along the rated breakage point will be required.

While there are shown and described preferred embodiments of the invention, it is to be distinctly understood that the invention is not limited thereto but may be embodied and practised within the scope of the following claims. Accordingly,

What I claim is:

1. An assembly module for a printed circuit board for the connection of screened conductors, comprising:
   a metallic grounding plate comprising multiple modules, each said module including means for fixedly connecting the module to a printed circuit board and at least one spring clamp conductively supported on the module, said clamp having an approximately shell-shaped conductor accommodating area for detachably enclosing at least one screened conductor; and said plate further including one rated breakage point between each two adjacent modules so that said adjacent modules can be separated from one another by breaking said plate at the rated breakage point.

2. An assembly module as defined in claim 1, wherein said spring clamp has a U-shape.

3. An assembly module as defined in claim 2, wherein said spring clamp has at least two shell-shaped conductor accommodating areas arranged one on top of the other for accommodating conductors having varying diameters.

4. An assembly module as defined in claim 1, wherein said spring clamp comprises a strain relief device.

5. An assembly module as defined in claim 1, wherein each said module includes slots for pass through accommodation of a cable coupler.

* * * * *